United States Patent
Chin et al.

(10) Patent No.: US 8,680,686 B2
(45) Date of Patent: Mar. 25, 2014

(54) METHOD AND SYSTEM FOR THIN MULTI CHIP STACK PACKAGE WITH FILM ON WIRE AND COPPER WIRE

(75) Inventors: Lai Nguk Chin, Penang (MY); Foong Yue Ho, Penang (MY); Wong Kwet Nam, Penang (MY); Thor Lee Lee, Penang (MY); Sally Foong, Milpitas, CA (US); Kevin Guan, Richmond, CA (US)

(73) Assignee: Spansion LLC, Sunnyvale, CA (US)

( * ) Notice: Subject to any disclaimer, the term of this patent is extended or adjusted under 35 U.S.C. 154(b) by 112 days.

(21) Appl. No.: 12/826,366

(22) Filed: Jun. 29, 2010

(65) Prior Publication Data
US 2011/0316158 A1    Dec. 29, 2011

(51) Int. Cl.
*H01L 23/48* (2006.01)

(52) U.S. Cl.
USPC ........... 257/776; 257/777; 257/741; 257/723; 257/E25.013; 257/E23.127; 257/E23.143; 438/109

(58) Field of Classification Search
USPC ......... 257/626, 686, 777, 678, 685, 741, 776, 257/723, E25.013, E23.127, E23.143; 438/109
See application file for complete search history.

(56) References Cited

U.S. PATENT DOCUMENTS

| | | | | |
|---|---|---|---|---|
| 6,569,709 | B2 * | 5/2003 | Derderian | 438/109 |
| 6,833,287 | B1 * | 12/2004 | Hur et al. | 438/107 |
| 7,723,852 | B1 * | 5/2010 | Kim et al. | 257/777 |
| 2002/0180020 | A1 | 12/2002 | Lin et al. | |
| 2005/0062166 | A1 | 3/2005 | Kang et al. | |
| 2005/0151253 | A1 * | 7/2005 | Nonaka et al. | 257/741 |
| 2005/0167810 | A1 | 8/2005 | Bai et al. | |
| 2007/0085184 | A1 | 4/2007 | Kwon et al. | |
| 2008/0128879 | A1 * | 6/2008 | Takiar et al. | 257/686 |
| 2008/0131999 | A1 * | 6/2008 | Takiar et al. | 438/109 |
| 2009/0321951 | A1 * | 12/2009 | Takiar et al. | 257/777 |
| 2010/0320584 | A1 * | 12/2010 | Takano | 257/686 |
| 2011/0070436 | A1 * | 3/2011 | Nguyen et al. | 428/355 EP |

OTHER PUBLICATIONS

Certified Priority Document of U.S. Appl. No. 11/679,094, filed Feb. 26, 2007 Related PCT Application PCT/US07/85839 46 pages.

* cited by examiner

Primary Examiner — Tu-Tu Ho

(57) ABSTRACT

A system and method for a thin multi chip stack package with film on wire and copper wire. The package comprises a substrate and a first die overlying the substrate. Copper wires electrically connect the first die to the substrate. A film overlies the first die and a portion of the copper wires. In addition, the film adheres a second die to the first die. The film also electrically insulates the copper wires from the second die.

13 Claims, 3 Drawing Sheets

METHOD AND SYSTEM FOR THIN MULTI CHIP STACK PACKAGE WITH FILM ON WIRE AND COPPER WIRE

FIELD

The present invention relates generally to integrated circuits, and more particularly to package structures for integrated circuits.

BACKGROUND

The semiconductor industry continually strives toward higher performance, lower cost, increased miniaturization of components, and greater packaging density of integrated circuits ("IC's"). As new generations of IC products are released, their functionality increases while the number of components needed to produce them decreases.

Semiconductor devices are constructed, for example, from a silicon or gallium arsenide wafer through a process that comprises a number of deposition, masking, diffusion, etching, and implanting steps. Usually, many individual devices are constructed on the same wafer. When the devices are separated into individual rectangular units, each takes the form of an IC die. In order to interface a die with other circuitry, it is common to mount the die on a substrate. Each die has bonding pads that are then individually connected in a wire-bonding operation to the substrate using extremely fine gold or aluminum wires. The assemblies are then packaged by individually encapsulation, for example, in molded plastic or ceramic bodies.

IC packaging technology has shown an increase in semiconductor chip density (the number of chips mounted on a single circuit board or substrate) that parallels the reduction in the number of components that are needed for a circuit. This results in packaging designs that are more compact, in form factors (the physical size and shape of a device) that are more compact, and in a significant increase in overall IC density. However, IC density continues to be limited by the space (or "real estate") available for mounting individual dies on a substrate.

To further condense the packaging of individual devices, multi-chip packages have been developed in which more than one device (such as an IC die) can be included in the same package. Of importance to such complicated packaging designs are considerations of input/output lead count, heat dissipation, matching of thermal expansion and contraction between a motherboard and its attached components, costs of manufacturing, ease of integration into an automated manufacturing facility, package reliability, and easy adaptability of the package to additional packaging interfaces such as a printed circuit board ("PCB").

In some cases, multi-chip devices can be fabricated faster and more cheaply than a corresponding single IC die that incorporates the same features and functions. Many such multi-chip modules have greatly increased circuit density and miniaturization, improved signal propagation speed, reduced overall device size and weight, improved performance, and lowered costs—all goals of the semiconductor industry.

However, such multi-chip modules can be bulky. IC package density is determined by the area required to mount a die or module on a circuit board. One method to reduce the board size of multi-chip modules is to stack the dies or chips vertically within the module or package. This increases their effective density.

Two of the common die stacking methods are: (a) larger lower die combined with a smaller upper die, and (b) so-called same-size die stacking. With the former, the dies can be very close vertically since the electrical bond pads on the perimeter of the lower die extend beyond the edges of the smaller die on top. With same-size die stacking, the upper and lower dies are spaced more vertically apart to provide sufficient clearance for the wire bonds of the lower die. Then, once the dies are mounted, gold or aluminum bond wires are attached to connect the wire bonding pads on the upper die and on the lower die with the ends of their associated leadframe lead extensions.

Other designs for mounting multiple semiconductor IC chips in a single, multi-chip package have included: a pair of IC dies mounted on opposite sides of a leadframe paddle, two chips mounted on two leadframe paddles, one chip mounted over a paddle and one below mounted on a board, an oblong chip that is rotated and attached on top of another oblong chip attached to a paddle below, one chip attached offset on top of another chip that is attached to a paddle below, one chip attached over another chip by separate spacers between it and the paddle, and various combinations thereof. Such configurations have also been extended to include three or more chips mounted together vertically in a single package.

Unfortunately, such practices for stacked and overlapping dies cause significant limitations for the wire bonding. These stacking arrangements typically entail attaching the upper die onto or immediately above the active surface of the lower die. Such stacking configurations cover or block some or all of the lateral edges of the bonding pads on the lower die. The mounted upper die thus interrupts the wire bond routing for the lower die. As a result, such upper and lower semiconductor dies cannot wire bond.

SUMMARY

Embodiments of the present invention are directed to a method and system for a thin multi chip stack package with film on wire and copper wire. In one embodiment, a stacked die package includes a first die attached to a substrate with an adhesive. A film on wire overlies the first die and at least a portion of first die copper wires. A second die overlies the film on wire. The first die copper wires electrically connect the first die to the substrate. Second die copper wires electrically connect the second die to the substrate. An encapsulant encapsulates the first die, the substrate, the adhesive, the first die copper wires, the film on wire, the second die, and the second die wires.

In some embodiments, the copper wires have a diameter between 25 µm and 13 µm. In some embodiments the copper wires are in an ultra low loop formation. In some embodiments the film on wire has a thickness between 60 µm and 25 µm.

In some embodiments, a second film overlies the second die and a portion of the second die copper wires. A third die overlies the second die film, and the second die film electrically insulates the second die copper wires from the third die.

These and other objects of the various embodiments of the present invention will be recognized by those of ordinary skill in the art after reading the following detailed description of the embodiments that are illustrated in the various drawing figures.

BRIEF DESCRIPTION OF THE DRAWINGS

The present invention is illustrated by way of example, and not by way of limitation, in the figures of the accompanying drawings and in which like reference numerals refer to similar elements.

DETAILED DESCRIPTION

Figure 1:
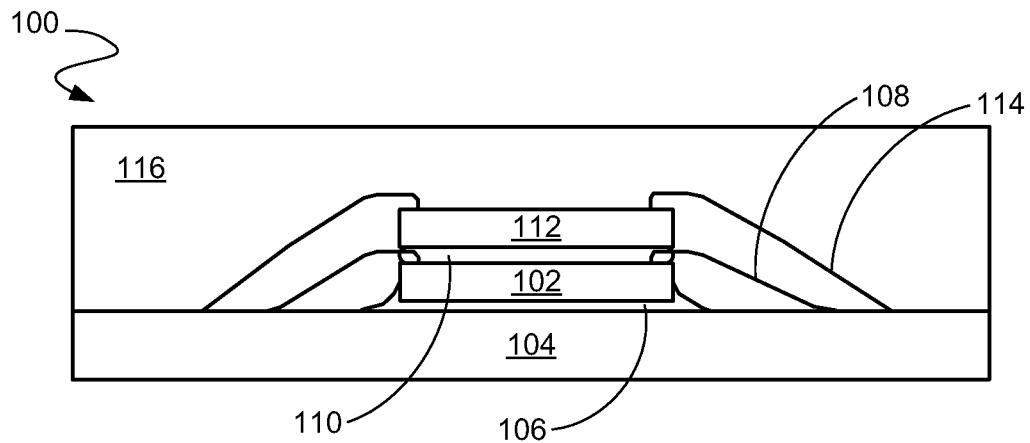
FIG. 1 is a cross sectional view of a stacked die package according to an embodiment of the present invention.

Reference will now be made in detail to embodiments in accordance with the present invention, examples of which are illustrated in the accompanying drawings. While the invention will be described in conjunction with these embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of embodiments of the present invention, numerous specific details are set forth in order to provide a thorough understanding of the present invention. However, it will be recognized by one of ordinary skill in the art that the present invention may be practiced without these specific details. In other instances, well-known methods, procedures, components, and circuits have not been described in detail as not to unnecessarily obscure aspects of the embodiments of the present invention.

The drawings showing embodiments of the system are semi-diagrammatic and not to scale and, particularly, some of the dimensions are for the clarity of presentation and are shown exaggerated in the drawing Figures. Also, where multiple embodiments are disclosed and described having some features in common, for clarity and ease of illustration, description, and comprehension thereof, like features one to another will ordinarily be described with like reference numerals.

The term "horizontal" as used herein is defined as a plane parallel to the plane or surface of the substrate, regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane.

The term "processing" as used herein includes deposition of material or photoresist, patterning, exposure, development, etching, cleaning, and/or removal of the material or photoresist as required in forming a described structure.

FIG. 1 is a cross sectional view of a stacked die package 100 according to an embodiment of the present invention. The stacked die package 100 is a device that includes a first die 102 attached to a substrate 104 with an adhesive 106. A film on wire 110 overlies on the first die 102 and at least a portion of first die copper wires 108. A second die 112 overlies the film on wire 110. The first die copper wires 108 electrically connect the first die 102 to the substrate 104. In addition, second die wires 114 electrically connect the second die 112 to the substrate 104. An encapsulant 116 encapsulates the first die 102, the substrate 104, the adhesive 106, the first die copper wires 108, the film on wire 110, the second die 112, and the second die wires 114.

Figure 2:
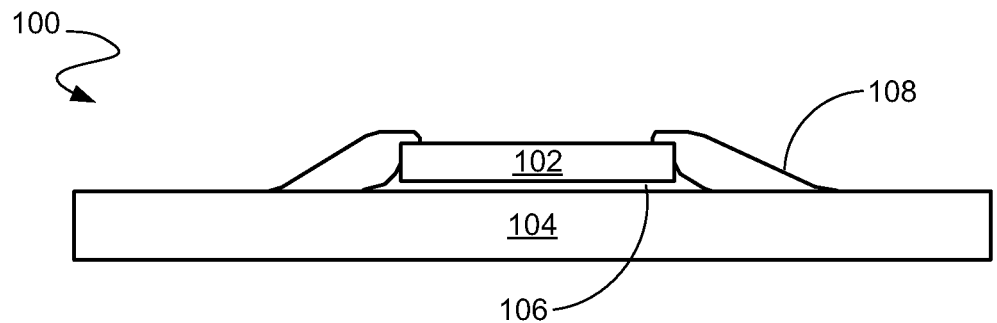
FIG. 2 is a cross sectional view of the stacked die package in an early stage of manufacture.

FIG. 2 is a cross sectional view of the stacked die package 100 in an early stage of manufacture. The first die 102 overlies the substrate 104 and has been attached to the substrate 104 with the adhesive 106. The adhesive 106 may be for example a wafer backside lamination film adhesive or dispensed epoxy. The first die copper wires 108 electrically connect the first die 102 to the substrate 104.

In the current embodiment, the first die copper wires 108 are in an ultra low loop formation, for example a folded loop formation or a reverse loop formation. However, in alternate embodiments the first die copper wires 108 may be configured in other low profile formations. In addition, in the current embodiment, the first die copper wires 108 have a diameter from 13 µm to 25 µm. However, in alternate embodiments, the first die copper wires 108 may have diameters less than 13 µm.

Figure 3:
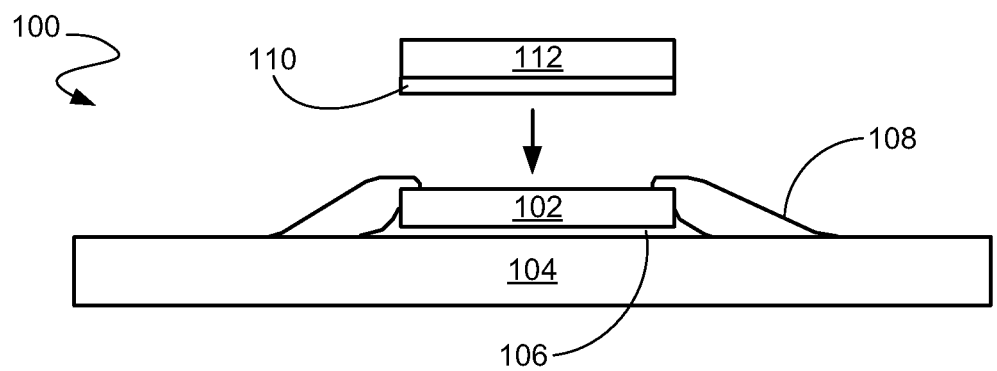
FIG. 3 is a cross sectional view of the stacked die package undergoing attachment of a second die.

FIG. 3 is a cross sectional view of the stacked die package 100 after further processing. The second die 112 is being attached to the first die 102. During attachment of the second die 112, the film on wire 110 adhesively connects the second die 112 to the first die 102 and the first die copper wires 108. In addition, the film on wire 110 electrically separates the first die copper wires 108 from the second die 112.

In the current embodiment, the film on wire 110 is the adhesive of the wafer backside lamination film of the second die 112. However in alternate embodiments, the film on wire 110 is precut to a predetermined width, length, and thickness, and then processed onto the first die 102 and the first die copper wires 108. In another embodiment, the film on wire 110 is applied as a liquid adhesive.

Figure 4:
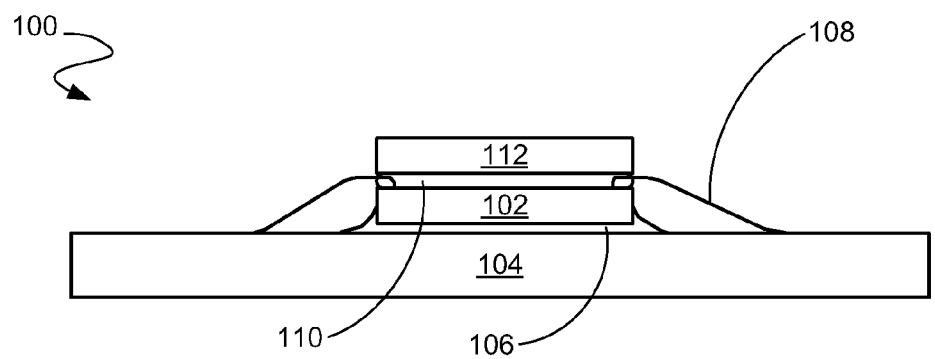
FIG. 4 is a cross sectional view of the stacked die package after placement of the second die.

FIG. 4 is a cross sectional view of the stacked die package 100 after further processing. The film on wire 110 overlies the first die 102. The film on wire 110 adheres to and coats the top of the first die 102 and at least a portion of the first die copper wires 108. The film on wire 110 is an electrical insulator that separates the first die copper wires 108 from the second die 112 by electrically insulating the first die copper wires 108 from the second die 112.

The thickness of the film on wire 110 is determined such that the height of the film on wire 110 is slightly higher than the first die copper wires 108. For example, in the current embodiment, the film on wire 110 has a thickness from 25 µm to 60 µm. However, in alternate embodiments, the film on wire 110 may have a thickness less than 25 µm.

Figure 5:
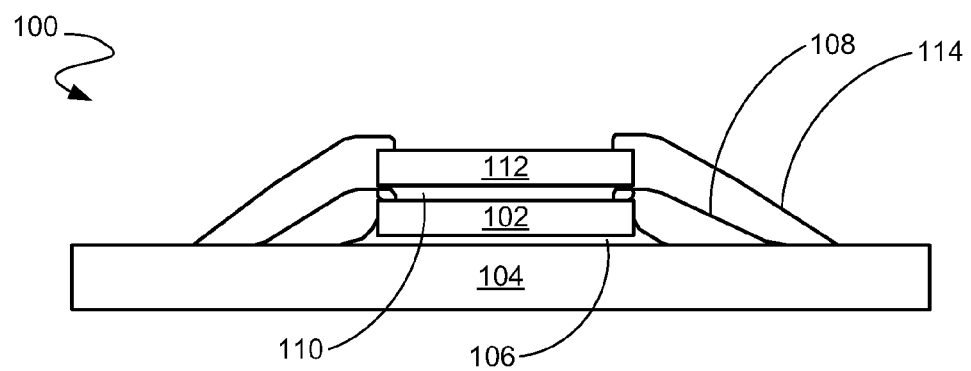
FIG. 5 is a cross sectional view of the stacked die package after the addition of wires to electrically connect the second die.

FIG. 5 is a cross sectional view of the stacked die package 100 after further processing. The second die wires 114 electrically connect the second die 112 to the substrate 104. In the current embodiment, the second die wires 114 are copper. However, in alternate embodiments, the second die wires 114 may be of any electrically conductive material, such as gold or aluminum.

Figure 6:
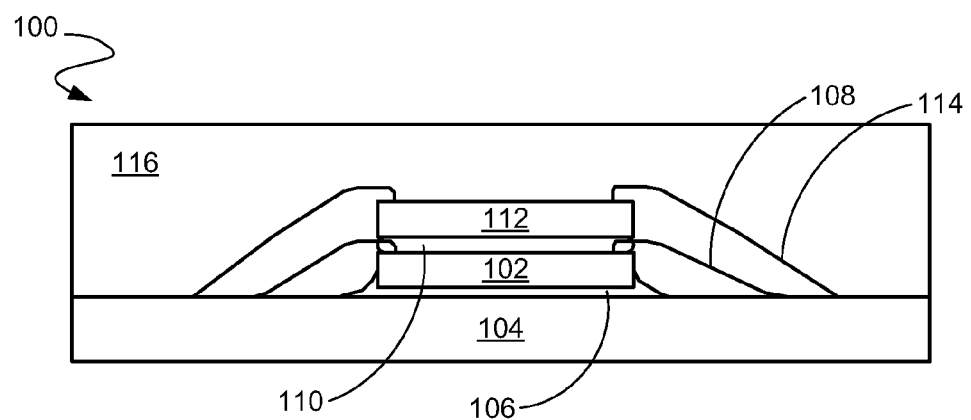
FIG. 6 is a cross sectional view of the stacked die package after encapsulation in an encapsulant.

FIG. 6 is a cross sectional view of the stacked die package 100 after further processing. The encapsulant 116 encases the first die 102, the substrate 104, the adhesive 106, the first die copper wires 108, the film on wire 110, the second die 112, and the second die wires 114.

Figure 7:
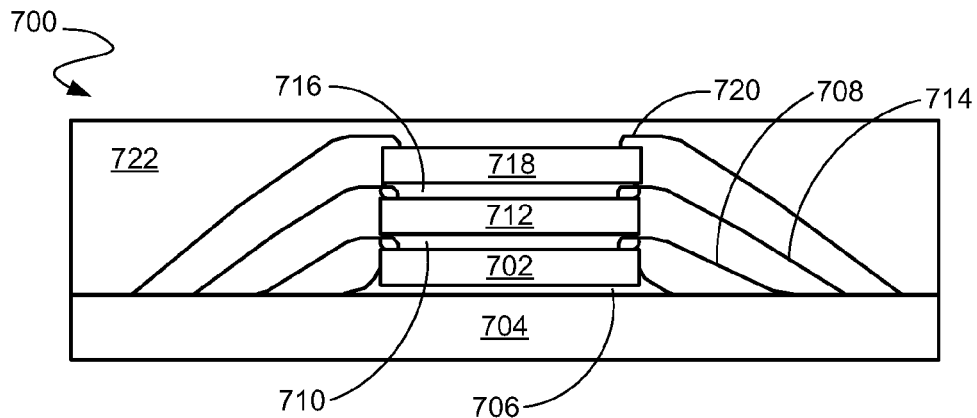
FIG. 7 is a cross sectional view of a stacked three die package according to an alternate embodiment of the present invention.

FIG. 7 is a cross sectional view of a triple stacked die package 700, according to an alternate embodiment of the present invention. In the current embodiment, three dies are stacked in the triple stacked die package 700. However, in alternate embodiments more than three dies may be stacked in a package.

The triple stacked die package 700 is a device that includes a first die 702 attached to a substrate 704 with an adhesive 706. A first film on wire 710 overlies the first die 702 and at least a portion of first die copper wires 708. A second die 712 overlies the first film on wire 710. The first die copper wires 708 electrically connect the first die 702 to the substrate 704. In addition, second die copper wires 714 electrically connect the second die 712 to the substrate 704.

The triple stacked die package 700 also includes a second film on wire 716 that overlies the second die 712 and at least a portion of second die copper wires 714. A third die 718 overlies the second film on wire 716. In addition, third die wires 720 electrically connect the third die 718 to the substrate 704. An encapsulant 722 encapsulates the first die 702, the substrate 704, the adhesive 706, the first die copper wires 708, the first film on wire 710, the second die 712, the second die copper wires 714, the second film on wire 716, the third die 718, and the third die wires 720.

In the current embodiment, the first die copper wires 708 and the second die copper wires 714 are in an ultra low loop formation, for example a folded loop formation or a reverse loop formation. However, in alternate embodiments the first die copper wires 708 and the second die copper wires 714 may be configured in other low profile formations. In addition, in the current embodiment, the first die copper wires 708 and the second die copper wires 714 have a diameter from 13 $\mu$m to 25 $\mu$m. However, in alternate embodiments, the first die copper wires 708 and the second die copper wires 714 may have diameters less than 13 $\mu$m. In the current embodiment, the third die wires 720 are copper. However, in alternate embodiments the third die wires 720 may be of any electrically conductive material, such as gold or aluminum.

The first film on wire 710 adheres to and coats the top of the first die 702 and at least a portion of the first die copper wires 708. Furthermore, the second film on wire 716 adheres to and coats the top of the second die 712 and at least a portion of the second die copper wires 714. In addition, the first film on wire 710 adhesively connects the second die 712 to the first die 702, and the second die on wire 716 adhesively connects the third die 718 to the second die 712.

The first film on wire 710 and the second film on wire 716 are electrical insulators that respectively separate the first die copper wires 708 from the second die 712 and the second die copper wires 714 from the third die 718 by electrically insulating the first die copper wires 708 from the second die 712 and the second die copper wires 714 from the third die 718. Thus, the first film on wire 710 electrically separates the first die copper wires 708 from the second die 712. In addition, the second film on wire 716 electrically separates the second die copper wires 714 from the third die 718.

The thickness of the first film on wire 710 is determined such that the height of the first film on wire 710 is slightly higher than the first die copper wires 708. In addition, the thickness of the second film on wire 716 is determined such that the height of the second film on wire 716 is slightly higher than the second die copper wires 714. For example, in the current embodiment, the first film on wire 710 and the second film on wire 716 each have a thickness from 25 $\mu$m to 60 $\mu$m. However, in alternate embodiments, the first film on wire 710 and the second film on wire 716 may each have a thickness less than 25 $\mu$m.

Figure 8:
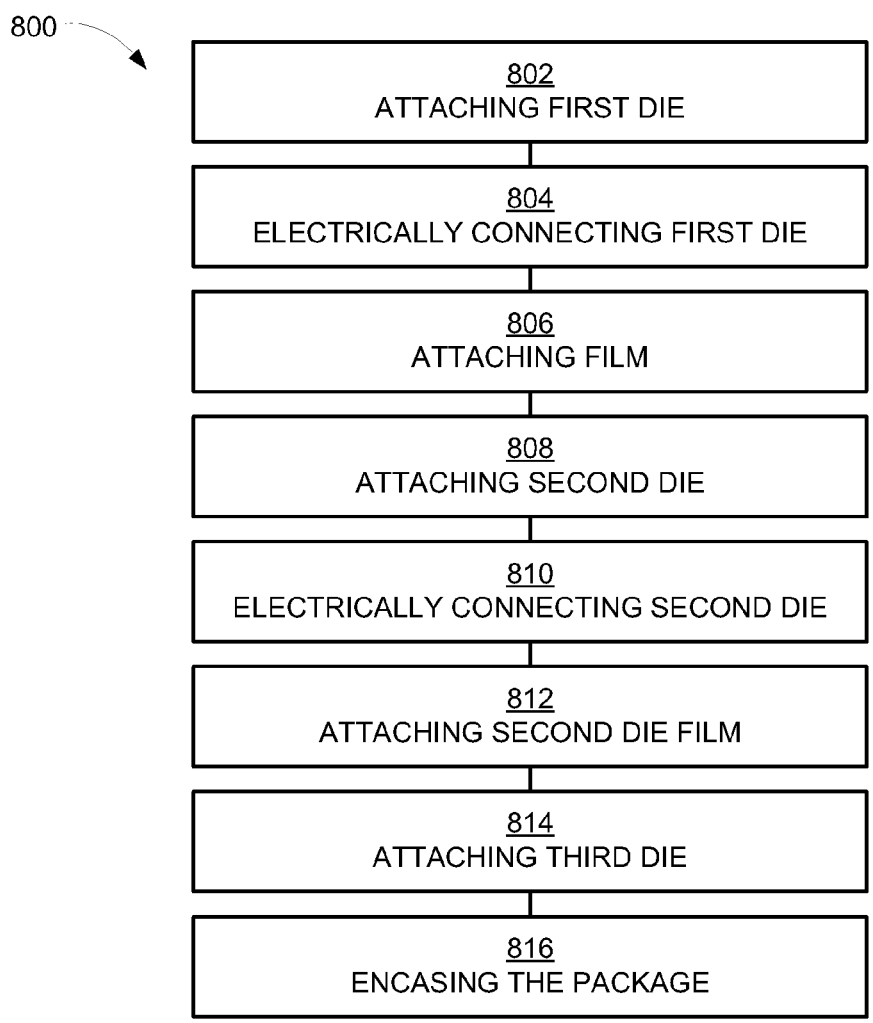
FIG. 8 is an exemplary flow diagram of a stacked die packaging system according to an embodiment of the present invention.

FIG. 8 depicts a flowchart 800 of an example of forming a stacked die package according to an embodiment of the present invention. Although specific steps are disclosed in the flowchart, such steps are exemplary. That is, embodiments of the present invention are well-suited to perform various other steps or variations of the steps recited in the flowchart.

In a step 802, a first die is attached to a substrate with an adhesive. In a step 804, the first die is electrically connected to the substrate with first die copper wires. The first die copper wires have diameters less than or equal to 25 $\mu$m and greater than or equal to 13 $\mu$m. In a step 806, a first film on wire is attached to a second die. The first film on wire has a thickness less than or equal to 60 $\mu$m and greater than or equal to 25 $\mu$m.

In a step 808, the second die is attached to the first die and the first die copper wires with the first film on wire. The first film on wire electrically insulates the copper wires from the second die. In a step 810, the second die is electrically connected to the substrate with second die copper wires.

In a step 812, a second film on wire is attached to a third die. In a step 814, the third die is attached to the second die and the second die copper wires with the second film on wire. The second film on wire electrically insulates the second die copper wires from the third die. In a step 816, the substrate, the first die, the adhesive, the first die copper wires, the first film on wire, the second die, the second die copper wires, the second film on wire, the third die, and the third die wires are encased in an encapsulant.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the invention and its practical applications, to thereby enable others skilled in the art to best utilize the invention and various embodiments with various modifications as may be suited to the particular use contemplated.

What is claimed is:

1. A device, comprising:
a substrate;
a first die overlying said substrate;
non-insulated copper wires electrically connecting said first die to said substrate, wherein said copper wires are coupled to said first die in an ultra low loop formation;
a film on wire layer adjacent to and completely overlaying said first die and a portion of said copper wires; and
a second die overlying said film on wire layer, wherein said film on wire layer electrically insulates said copper wires and said first die from said second die, wherein said first and second dies are configured in a thin-stacked die formation, wherein said film on wire layer comprises an adhesive connecting said first die and said second die without an intermediate layer, and wherein said film on wire layer comprises a wafer backside lamination film of said second die, and wherein said copper wires have a diameter less than or equal to 25 $\mu$m, and said film on wire layer has a thickness less than or equal to 60 $\mu$m.

2. The device of claim 1 wherein said copper wires have a diameter less than or equal to 13 $\mu$m, and said film on wire layer has a thickness less than or equal to 25 $\mu$m.

3. The device of claim 1 wherein said copper wires are in a folded loop formation.

4. The device of claim 1 wherein said copper wires are in a reverse loop formation.

5. The device of claim 1 further comprising an encapsulant that encapsulates said substrate, said first die, said copper wires, said film on wire layer, and said second die.

6. A device, comprising:

a substrate;

a first die overlying said substrate;

an adhesive attaching said first die to said substrate;

non-insulated copper wires electrically connecting said first die to said substrate, wherein said copper wires are coupled to said first die in an ultra low loop formation;

a first electrical insulator adjacent to and completely overlaying said first die, wherein said first electrical insulator coating a portion of said copper wires;

a second die overlying said first electrical insulator, wherein said first electrical insulator electrically separates said copper wires and said first die from said second die, wherein said first electrical insulator comprises an adhesive comprising a film on wire layer and connecting said first die and said second die without an intermediate layer, and wherein said first electrical insulator comprises a wafer backside lamination film of said second die; and second die wires electrically connecting said second die to said substrate, wherein said second die wires are coupled to said second die in an ultra low loop formation, and wherein said copper wires have a diameter less than or equal to 25 μm and greater than or equal to 13 μm, and said electrical insulator has a thickness less than or equal to 60 μm and greater than or equal to 25 μm.

7. The device of claim 6 wherein said second die wires comprise copper.

8. The device of claim 6 wherein said electrical insulator adhesively connects said second die to said first die.

9. The device of claim 6 further comprising a molding compound that encases said substrate, said first die, said adhesive, said copper wires, said electrical insulator, said second die, and said second die wires.

10. A method, comprising:

attaching a first die to a substrate with an adhesive;

electrically connecting said first die to said substrate with non-insulated copper wires in an ultra low loop formation;

attaching a film on wire layer to a second die, wherein said film on wire layer comprises an adhesive suitable for connecting said first die and said second die as a wafer backside lamination film;

attaching said film on wire layer having a thickness less than or equal to 60 μm and greater than or equal to 25 μm to said first die and said copper wires without an intermediate layer, wherein said film on wire layer is adjacent to and completely overlays said first die and electrically insulates said copper wires and said first die from said second die; and electrically connecting said second die to said substrate with second copper wires in an ultra low loop formation, wherein said first and second dies are configured in a thin-stacked die formation.

11. The method of claim 10 wherein electrically connecting said second die to said substrate comprises electrically connecting said second die to said substrate with copper wires.

12. The method of claim 10 wherein electrically connecting said first die to said substrate with copper wires comprises electrically connecting said first die to said substrate with copper wires having a diameter less than or equal to 25 μm and greater than or equal to 13 μm.

13. The method of claim 10 further comprising encasing said substrate, said first die, said adhesive, said copper wires, said film on wire layer, and said second die in an encapsulant.

\* \* \* \* \*